(12) United States Patent
Lee et al.

(10) Patent No.: US 9,929,337 B2
(45) Date of Patent: Mar. 27, 2018

(54) PIEZOELECTRIC DEVICE PACKAGE AND METHOD OF FABRICATING THE SAME

(71) Applicant: SAMSUNG ELECTRO-MECHANICS CO., LTD., Suwon-Si, Gyeonggi-Do (KR)

(72) Inventors: Soon Bum Lee, Suwon-Si (KR); Sang Yeob Cha, Suwon-Si (KR); Jong Pil Lee, Suwon-Si (KR); Katsushi Yasuda, Suwon-Si (KR)

(73) Assignee: SAMSUNG ELECTRO-MECHANICS CO., LTD., Suwon-si, Gyeonggi-Do (KR)

( * ) Notice: Subject to any disclaimer, the term of this patent is extended or adjusted under 35 U.S.C. 154(b) by 594 days.

(21) Appl. No.: 14/294,910

(22) Filed: Jun. 3, 2014

(65) Prior Publication Data
US 2014/0355647 A1 Dec. 4, 2014

(30) Foreign Application Priority Data
Jun. 3, 2013 (KR) .................. 10-2013-0063533

(51) Int. Cl.
| | |
|---|---|
| H03B 5/32 | (2006.01) |
| H01L 41/25 | (2013.01) |
| H03B 5/36 | (2006.01) |
| H01L 41/08 | (2006.01) |
| H01L 41/22 | (2013.01) |
| H03L 1/00 | (2006.01) |
| G01K 1/14 | (2006.01) |
| H03H 9/08 | (2006.01) |
| H03H 9/02 | (2006.01) |
| H03H 9/10 | (2006.01) |

(52) U.S. Cl.
CPC .............. *H01L 41/25* (2013.01); *G01K 1/14* (2013.01); *H01L 41/08* (2013.01); *H01L 41/22* (2013.01); *H03B 5/36* (2013.01); *H03H 9/02102* (2013.01); *H03H 9/08* (2013.01); *H03H 9/1021* (2013.01); *H03L 1/00* (2013.01); *Y10T 29/42* (2015.01)

(58) Field of Classification Search
CPC ........... H03B 5/36; H01L 41/22; H01L 41/08; H03L 1/00
USPC .................................. 331/158, 68, 176, 69
See application file for complete search history.

(56) References Cited

U.S. PATENT DOCUMENTS

| | | | |
|---|---|---|---|
| 2005/0225406 A1* | 10/2005 | Miura | .............. H03L 1/04 331/176 |
| 2012/0229225 A1 | 9/2012 | Horie | |

FOREIGN PATENT DOCUMENTS

| | | |
|---|---|---|
| CN | 101771428 A | 7/2010 |
| CN | 202814620 U | 3/2013 |

(Continued)

OTHER PUBLICATIONS

Chinese Office Action dated Jul. 5, 2016 issued in Chinese Patent Application No. 201410239007.9 (English translation).

(Continued)

*Primary Examiner* — Arnold Kinkead
(74) *Attorney, Agent, or Firm* — McDermott Will & Emery LLP

(57) ABSTRACT

A piezoelectric device package may include: a case having a plurality of terminals formed on a lower surface thereof; a piezoelectric device formed in the case; a temperature measuring device formed on the lower surface of the case and having a thin film form; and a cover member enclosing an upper portion of the case.

7 Claims, 5 Drawing Sheets

(56) References Cited

FOREIGN PATENT DOCUMENTS

| | | |
|---|---|---|
| JP | 11-265955 A | 9/1999 |
| JP | 2005-244925 A | 9/2005 |
| JP | 2006-191327 A | 7/2006 |
| JP | 2012-249265 A | 12/2012 |
| JP | 2013-055572 A | 3/2013 |
| JP | 2013-058864 A | 3/2013 |
| KR | 10-2005-0030814 A | 3/2005 |
| KR | 10-2012-0052821 A | 5/2012 |
| KR | 10-2012-0103401 A | 9/2012 |
| KR | 10-1227837 B1 | 1/2013 |

OTHER PUBLICATIONS

Korean Office Action issued in Korean Application No. 10-2013-0063533 dated Sep. 11, 2014 with English Translation.
Notice of Office Action dated May 26, 2015 issued in Japanese Patent Application No. 2014-113779 (English translation).

\* cited by examiner

PIEZOELECTRIC DEVICE PACKAGE AND METHOD OF FABRICATING THE SAME

CROSS-REFERENCE TO RELATED APPLICATION

This application claims the benefit of Korean Patent Application No. 10-2013-0063533 filed on Jun. 3, 2013, with the Korean Intellectual Property Office, the disclosure of which is incorporated herein by reference.

BACKGROUND

The present disclosure relates to a piezoelectric device package and a method of fabricating the same, and more particularly, to a piezoelectric device package capable of solving a frequency matching problem due to a temperature deviation by accurately measuring a temperature of a piezoelectric device, and a method of fabricating the same.

A quartz vibrator is commonly known as a quartz oscillator and is fabricated by forming electrodes of a conductive material such as Au or Ag on both surfaces of a thin quartz vibrator. When a voltage is applied to the electrodes, deformation force occurs due to an electrostrictive effect, and vibrations occur by the deformation force. When the vibrations occur, a voltage is generated in the electrode by a piezoelectric effect. In this case, a frequency depending on the vibrations is determined depending on dynamic properties or a size of the thin quartz vibrator. Generally, the thin quartz vibrator is stable with respect to a change in temperature, or the like, and has a very high Q value.

In order to control a frequency in a mobile communications apparatus using these properties, the quartz vibrator is used. The quartz vibrator should maintain a stable frequency constant with respect to a change in an external temperature in a wide use temperature range.

However, the quartz vibrator may demonstrate frequency change characteristics with respect to an actual temperature. Therefore, a quartz vibrator having more stable and accurate characteristics by including a compensating circuit compensating for a frequency depending on the temperature to decrease a change in the frequency depending on the temperature may be implemented.

The following Related Art Document (Patent Document 1) relates to a piezoelectric device and a method of fabricating the same.

The following Patent Document 1 uses a temperature measuring device in chip form, unlike the present disclosure, such that precise correction of a frequency of a piezoelectric device depending on a temperature, which is possible in the present disclosure using a temperature measuring device in a thin film form, is impossible.

RELATED ART DOCUMENT (Patent Document 1) Korean Patent No. 10-1227837

SUMMARY

An aspect of the present disclosure may provide a piezoelectric device package capable of significantly decreasing a difference between a temperature of a temperature measuring device and a temperature of a piezoelectric device, and a method of fabricating the same.

According to an aspect of the present disclosure, a piezoelectric device package may include: a case having a plurality of terminals formed on a lower surface thereof; a piezoelectric device formed in the case; a temperature measuring device formed on the lower surface of the case and having a thin film form; and a cover member enclosing an upper portion of the case.

The piezoelectric device may have a first excitation electrode formed on an upper surface thereof and have a second excitation electrode formed on a lower surface thereof, the first and second excitation electrodes being extendedly formed on corners of the lower surface of the piezoelectric device, respectively.

The case may have first piezoelectric device connecting electrodes formed on some corners of a bottom surface of an inner portion thereof so as to correspond to the corners of the piezoelectric device on which the first and second excitation electrodes are formed.

The piezoelectric device may have dummy electrodes formed on a lower surface thereof.

The plurality of terminals may include a temperature measuring device input terminal, a temperature measuring device output terminal, a piezoelectric device input terminal, and a piezoelectric device output terminal each disposed on corners of a lower surface of the case in a clockwise direction or a counterclockwise direction.

The cover member may be formed of a metal.

One of the terminals and the cover member may be electrically connected to each other.

According to another aspect of the present disclosure, a method of fabricating a piezoelectric device package may include mounting a piezoelectric device in a case; coupling a cover member to an upper portion of the case; and coupling a temperature measuring device having a thin film form to a lower portion of the case.

BRIEF DESCRIPTION OF DRAWINGS

The above and other aspects, features and other advantages of the present disclosure will be more clearly understood from the following detailed description taken in conjunction with the accompanying drawings, in which.

DETAILED DESCRIPTION

Figure 1:
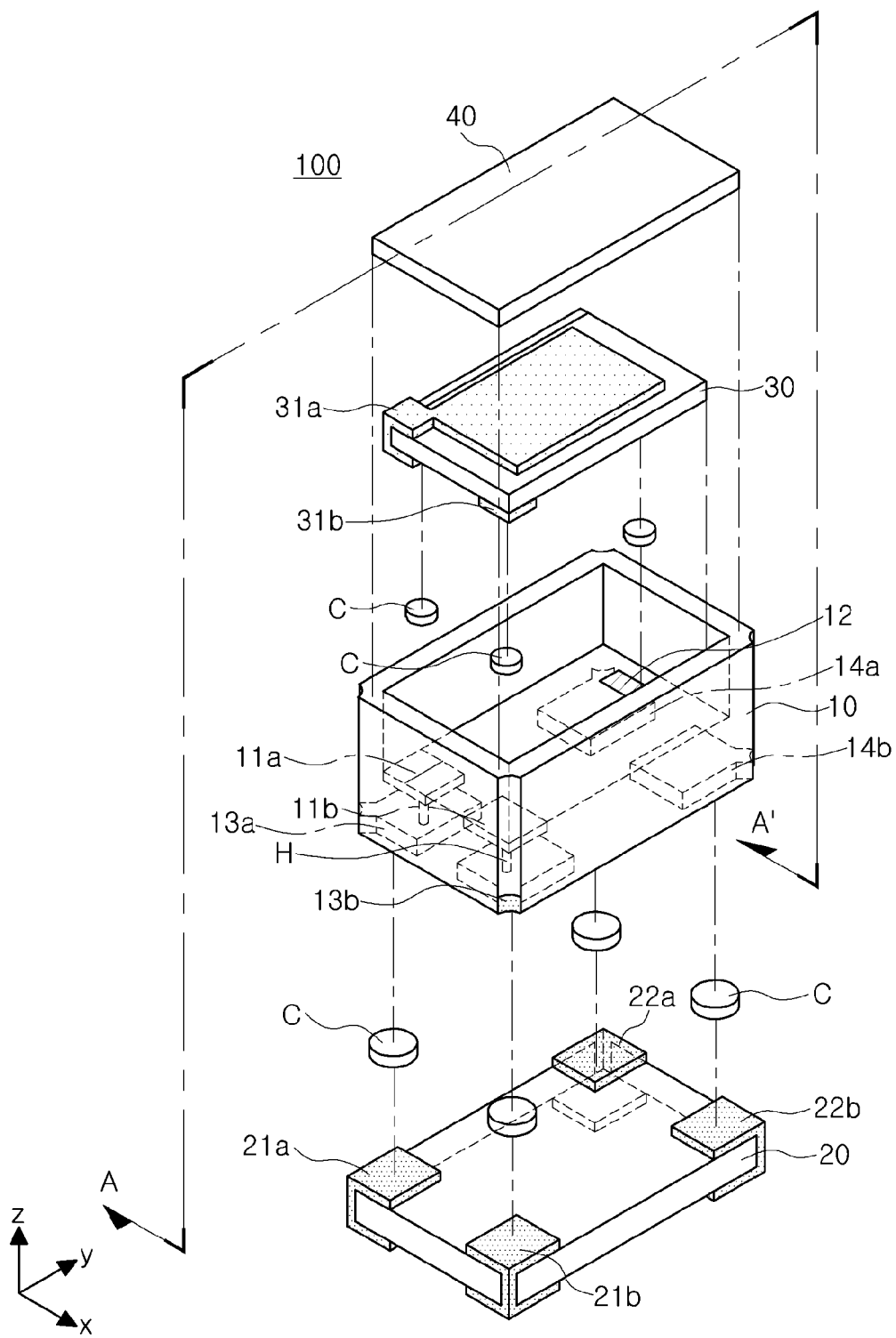
FIG. 1 is a schematic exploded perspective view of a piezoelectric device package according to an exemplary embodiment of the present disclosure.

Hereinafter, embodiments of the present disclosure will be described in detail with reference to the accompanying drawings. The disclosure may, however, be embodied in many different forms and should not be construed as being limited to the embodiments set forth herein. Rather, these embodiments are provided so that this disclosure will be thorough and complete, and will fully convey the scope of the disclosure to those skilled in the art. In the drawings, the shapes and dimensions of elements maybe exaggerated for clarity, and the same reference numerals will be used throughout to designate the same or like elements.

Figure 2:
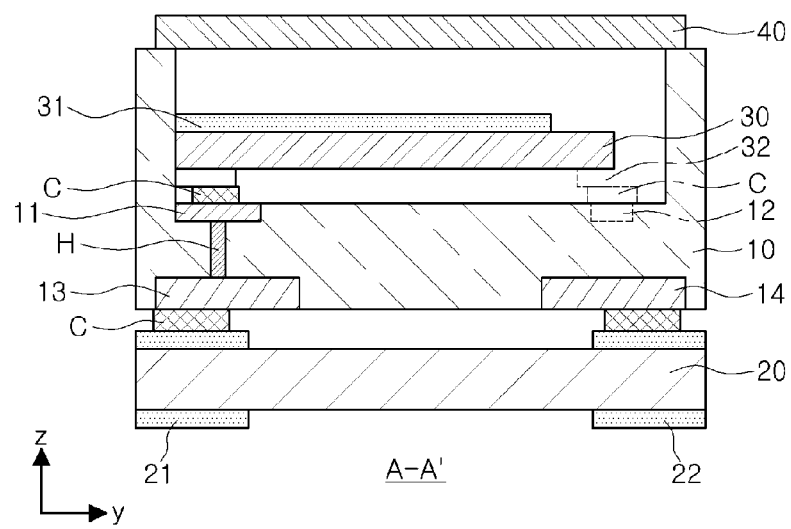
FIG. 2 is a schematic cross-sectional view taken along line A-A' of FIG. 1.

FIG. 1 is a schematic exploded perspective view of a piezoelectric device package 100 according to an exemplary embodiment of the present disclosure; and FIG. 2 is a schematic cross-sectional view taken along line A-A' of FIG. 1.

A structure of a piezoelectric device package 100 according to an exemplary embodiment of the present disclosure will be described with reference to FIGS. 1 and 2.

The piezoelectric device package 100 according to an exemplary embodiment of the present disclosure may include a case 10, a temperature measuring device 20 and a piezoelectric device 30 mounted in the case 10, and a cover member 40 positioned above the case 10.

In more detail, the piezoelectric device package 100 according to an exemplary embodiment of the present disclosure may include the case 10 having a plurality of terminals 13 and 14 formed on a lower surface thereof; the piezoelectric device 30 formed in the case 10; the temperature measuring device 20 formed on the lower surface of the case 10 and having a thin film form; and the cover member 40 enclosing an upper portion of the case 10.

The piezoelectric device 30 may be formed by cutting a quartz plate formed of $SiO_2$ and forming first and second excitation electrodes 31a and 31b formed on upper and lower surfaces of the quartz plate, respectively. The piezoelectric device 30 may be electrically connected to a piezoelectric device input terminal and a piezoelectric device output terminal by a first piezoelectric device connecting electrode 11 formed in the case to thereby be directly connected to an external integrated circuit.

The first and second excitation electrodes 31a and 31b maybe extendedly formed on corners of the lower surface of the piezoelectric device 30, respectively.

The piezoelectric device 30 and the first piezoelectric device connecting electrode 11 formed in the case 10 may be electrically connected to each other by connecting parts C.

The piezoelectric device may include the first and second excitation electrodes 31a and 31b in order to be connected to the external integrated circuit.

The first excitation electrode 31a may serve as an input terminal of the piezoelectric device 30, and the second excitation electrode 31b may serve as an output terminal of the piezoelectric device 30.

The first and second excitation electrodes 31a and 31b may be electrically connected, respectively, to first piezoelectric device connecting electrodes 11a and 11b positioned in the case 10, and the first piezoelectric device connecting electrodes 11a and 11b may be electrically connected to second piezoelectric device connecting electrodes 21a and 21b of the temperature measuring device 20, respectively, to thereby be electrically connected to an integrated circuit.

That is, in the piezoelectric device package 100 according to an exemplary embodiment of the present disclosure, the temperature measuring device 20 is closely adhered and coupled to a lower portion of the case 10 in which the piezoelectric device 30 is mounted, whereby the piezoelectric device package 100 may be simply completed.

In addition, an interval between the temperature measuring device 20 and the piezoelectric device 30 is significantly decreased through the electrical connection as described above, whereby a temperature difference between the temperature measuring device 20 and the piezoelectric device 30 may be significantly decreased.

The piezoelectric device 30 may have a dummy electrode 32 formed on some corners of a lower surface thereof.

The dummy electrode 32 maybe connected to a case dummy electrode 12 of the case 10 through the connecting parts C.

The dummy electrode 32 is connected to the case dummy electrode 12 to increase adhesion of the piezoelectric device 30, such that a phenomenon that the piezoelectric device 30 is separated by external impact is prevented, whereby reliability of the piezoelectric device package 100 may be improved.

Referring to FIG. 2, the temperature measuring device 20 may be coupled to the lower portion of the case 10 to measure a temperature of the case 10 in which the piezoelectric device 30 is mounted.

The temperature measuring device 20 may have a thin film form in which it includes a plurality of electrodes 21 and 22 formed on corners thereof.

The temperature measuring device 20 may be a thermistor, but is not limited thereto.

In addition to the thermistor, a thin film temperature measuring device capable of measuring an internal temperature of the piezoelectric device package and transferring information on the measured temperature to the external integrated circuit (IC) may be used.

Since the thermistor is connected to a power supply and has a predetermined resistance value depending on a temperature of the thermistor, a temperature of the case 10 in which the thermistor is mounted may be measured by measuring the resistance value of the thermistor.

The temperature measured in the scheme as described above may be received in the integrated circuit and be used as a value for compensating for a temperature-frequency change of the piezoelectric device 30 mounted in the piezoelectric device package 100.

According to an exemplary embodiment of the present disclosure, the temperature measuring device 20 may include temperature measuring device input and output electrodes 22a and 22b, wherein the temperature measuring device input electrode 22a is connected to a power supply and the temperature measuring device output electrode 22b is connected to an integrated circuit to measure a resistance value depending on temperature-resistance change characteristics depending on a predetermined voltage, thereby measuring the temperature value.

The temperature measuring device input and output electrodes 22a and 22b may be connected to some of the plurality of the terminals 14 formed on the lower surface of the case 10.

The temperature measuring device input and output electrodes 22a and 22b and the plurality of the terminals 14 formed on the lower surface of the case 10 are connected to each other, whereby coupling force between the case 10 in which the piezoelectric device 30 is mounted and the temperature measuring device 20 may be improved.

Therefore, a phenomenon that the case 10 is separated from the temperature measuring device 20 due to external impact is prevented, whereby reliability of the piezoelectric device package 100 may be improved.

At least one of a plurality of terminals 13 and 14 formed on the lower surface of the case 10 maybe electrically connected to the cover member 40 through a penetration part T.

The cover member 40 may be formed of a material having excellent conductivity to serve as a ground of the piezoelectric device 30 or the temperature measuring device 20.

The cover member 40 may serve as the ground to prevent noise when the piezoelectric device package 100 generates a frequency and to significantly decrease an influence from the outside.

The cover member 40 may be formed of copper (Cu), but is not limited thereto.

The cover member 40 may serve as the ground, such that a separate process and component for a ground are not required.

Particularly, the temperature measuring device input and output electrodes 22a and 22b and the terminals 14 of the case 10 are electrically connected to each other and the terminals 14 are electrically connected to the cover member 40 through the penetration part T, whereby the cover member 40 may serve as a ground of the temperature measuring device 20.

The first piezoelectric device connecting electrodes 11a and 11b formed in the case 10 may be electrically connected to the terminals 13 formed on the lower surface through conductive vias H, respectively.

The case 10 may be formed of ceramic or polymer, but is not limited thereto.

A bottom surface of the case 10 may be formed of a material having excellent thermal conductivity or be formed of a material prepared by dispersing the material having excellent thermal conductivity in ceramic to allow temperatures of the piezoelectric device 30 and the temperature measuring device 20 to be as equal to each other as possible.

The bottom surface of the case may be formed of epoxy having excellent thermal conductivity.

Figure 3A:
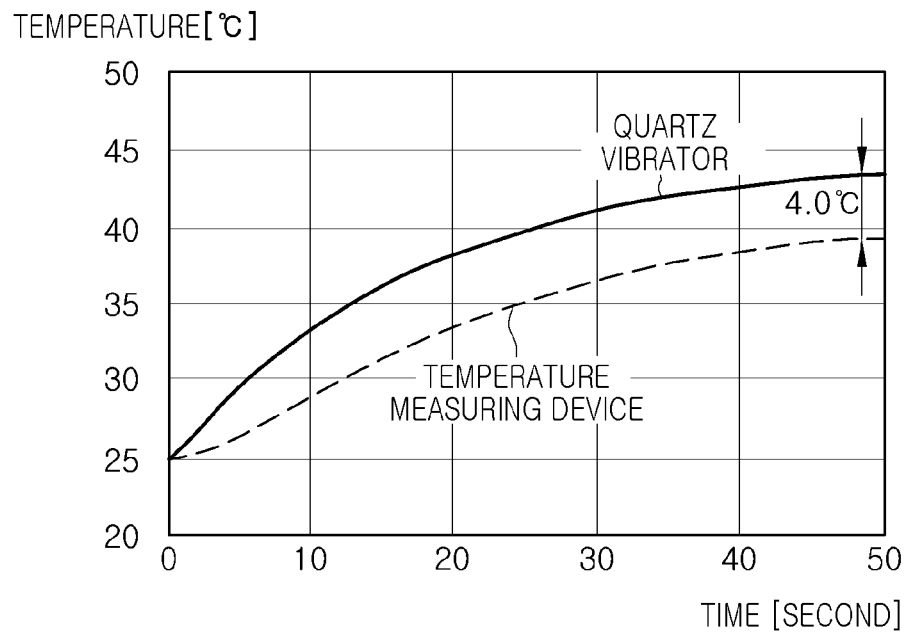
FIG. 3A is a graph showing temperatures of a piezoelectric device and a temperature measuring device depending on an operation time according to the related art.
Figure 3B:
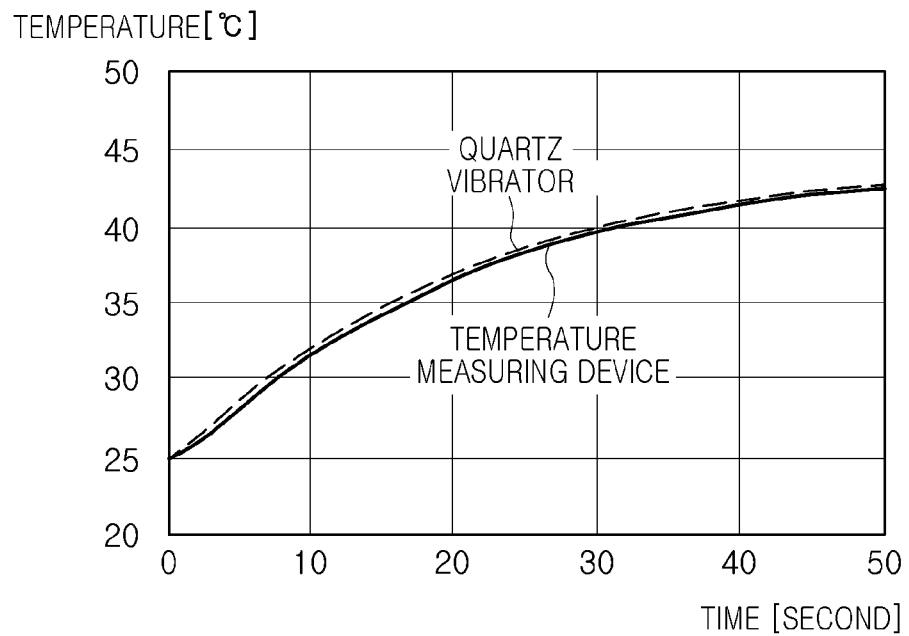
FIG. 3B is a graph showing a temperature difference between a piezoelectric device and a temperature measuring device depending on an operation time according to an exemplary embodiment of the present disclosure.

FIG. 3A is a graph showing temperatures of a piezoelectric device and a temperature measuring device depending on an operation time according to the related art; and FIG. 3B is a graph showing a temperature difference between a piezoelectric device and a temperature measuring device depending on an operation time according to an exemplary embodiment of the present disclosure.

Referring to FIG. 3A, it may be appreciated that as an operation time becomes long, the temperature difference between the temperature measuring device and the piezoelectric device is gradually increased.

However, in the case of the piezoelectric device package 100 according to an exemplary embodiment of the present disclosure, the temperature measuring device 20 having the thin film form is used, such that the interval between the temperature measuring device 20 and the piezoelectric device 30 may be relatively very narrow.

Therefore, the temperature difference between the piezoelectric device 30 and the temperature measuring device 20 may be significantly decreased. As a result, a temperature deviation between the piezoelectric device 30 and a frequency is decreased, whereby the piezoelectric device package 100 having more stable and accurate characteristics may be provided.

According to the related art, an interval between the piezoelectric device 30 and the temperature measuring device 20 was large, such that an accurate temperature of the piezoelectric device may not be obtained. Therefore, it was difficult to compensate for an accurate temperature deviation depending on a temperature-frequency change.

However, according to an exemplary embodiment of the present disclosure, the temperature measuring device 20 closely adhered to the case 10 may measure a temperature of the case 10 closely adhered to the piezoelectric device 30, thereby measuring an accurate temperature of the piezoelectric device 30. Therefore, an accurate temperature deviation depending on a temperature-frequency change may be compensated for.

As a result, precision of a frequency of the piezoelectric device package 100 may be secured.

Figure 4:
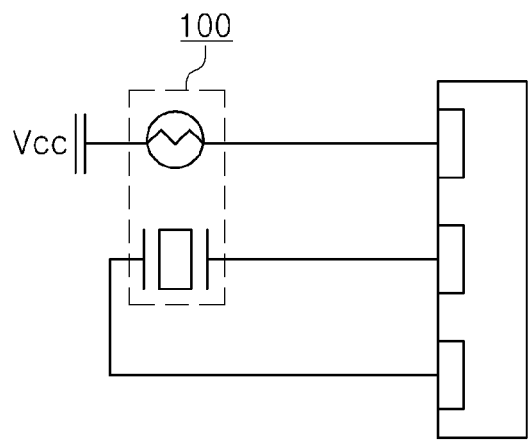
FIG. 4 is a circuit diagram of the piezoelectric device package according to an exemplary embodiment of the present disclosure.

FIG. 4 is a circuit diagram of the piezoelectric device package according to an exemplary embodiment of the present disclosure.

The temperature measuring device 20 may be connected to a power supply Vcc and may have an appropriate resistance value depending on a temperature.

As a result, a temperature of the case 10 maybe measured by measuring the resistance value of the temperature measuring device 20.

The measured temperature may be input to an integrated circuit (IC) including a temperature compensating circuit, and the integrated circuit (IC) may receive a frequency from the piezoelectric device 30, which is a frequency supplying source, and compensate for received frequency change characteristics depending on a temperature of the received frequency to solve a frequency matching problem due to a temperature deviation.

Figure 5:
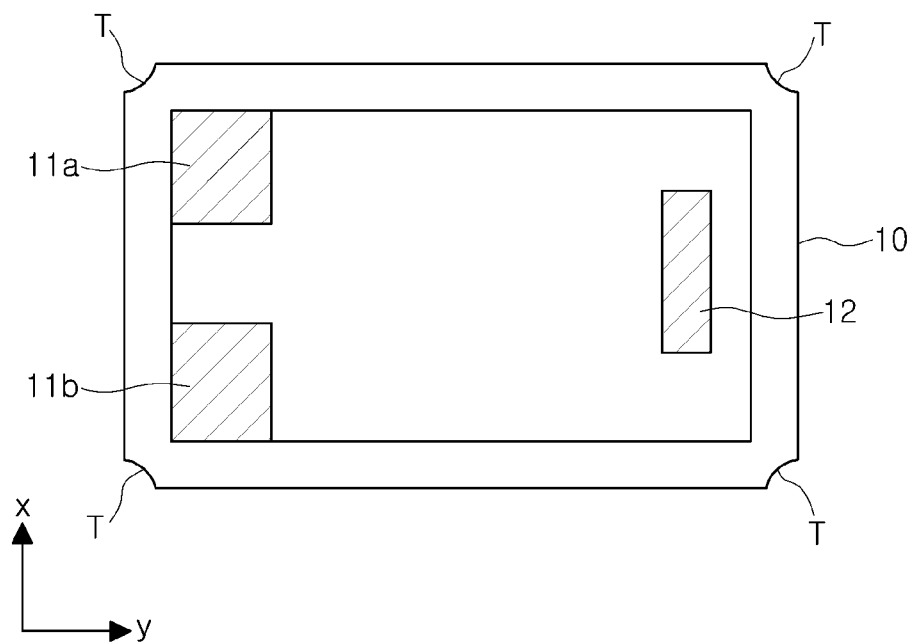
FIG. 5 is a top view of the piezoelectric device package according to an exemplary embodiment of the present disclosure.
Figure 6:
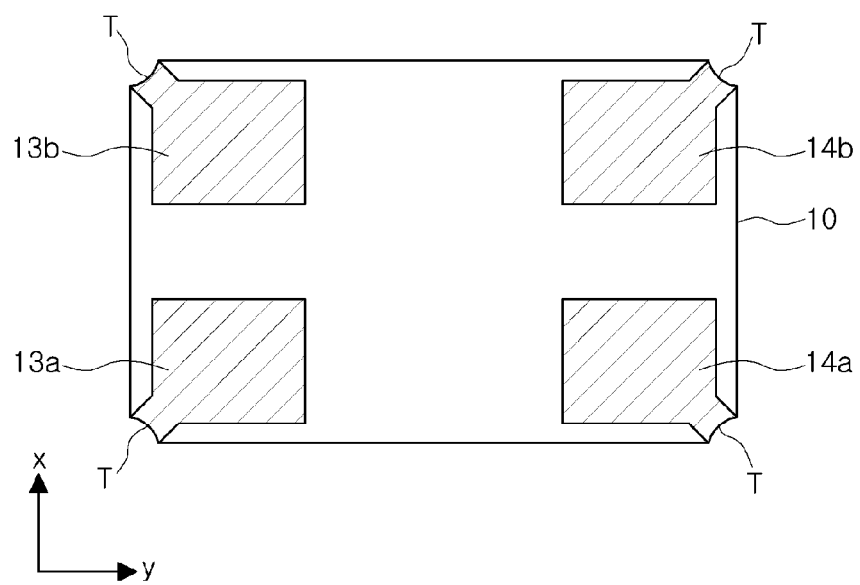
FIG. 6 is a bottom view of the piezoelectric device package according to an exemplary embodiment of the present disclosure.

FIG. 5 is a top view of the case 10 according to an exemplary embodiment of the present disclosure; and FIG. 6 is a bottom view of the case 10 according to an exemplary embodiment of the present disclosure.

Referring to FIG. 5, the first piezoelectric device connecting electrodes 11a and 11b and the case dummy electrode 12 may be formed in the case 10.

The first piezoelectric device connecting electrodes 11a and 11b may be electrically connected, respectively, to the first and second excitation electrodes 31a and 31b and the second piezoelectric device connecting electrodes 21a and 21b formed on the temperature measuring device 20.

Referring to FIG. 6, the plurality of terminals 13 and 14 may be formed on the corners of the lower surface of the case 10.

The plurality of terminals may include a temperature measuring device input terminal, a temperature measuring device output terminal, a piezoelectric device input terminal, and a piezoelectric device output terminal.

Some of the terminals 13 may be electrically connected to the first piezoelectric device connecting electrodes 11a and 11b formed in the case 10 through the conductive vias H, respectively.

In addition, the case 10 may have a ground terminal (not shown) additionally formed on the lower surface thereof.

A method of fabricating a piezoelectric device package 100 according to another exemplary embodiment of the present disclosure may include mounting a piezoelectric device 30 in a case 10; coupling a cover member 40 to an upper portion of the case 10; and coupling a temperature measuring device 20 having a thin film form to a lower portion of the case 10.

The case 10 having the piezoelectric device 30 mounted therein is stacked on and coupled to an upper portion of the temperature measuring device 20, whereby the piezoelectric device package 100 may be completed.

That is, a separate process of positioning the temperature measuring device 20 may not be required, and a process of forming a cavity at which the temperature measuring device 20 is to be positioned in the case may not be required.

In addition, since the case 10 having the piezoelectric device 30 mounted thereon and the temperature measuring device 20 are separately fabricated and are then coupled to each other, the entire piezoelectric device package 100 does not need to be discarded even in the case in which a defect occurs in at least one of the piezoelectric device 30 and the temperature measuring device 20.

In other words, even though the defect occurs in at least one of the piezoelectric device 30 and the temperature measuring device 20, a component in which the defect does not occur may be again used, whereby a yield may be improved and a process cost may be decreased.

As set forth above, with the piezoelectric device package according to an exemplary embodiment of the present disclosure, the temperature measuring device having the thin film form is used, whereby the temperature difference between the piezoelectric device and the temperature measuring device may be significantly decreased.

In detail, the temperature of the piezoelectric device may be accurately measured. Therefore, the temperature deviation between the piezoelectric device and the frequency is decreased, whereby the piezoelectric device having more stable and accurate characteristics may be provided.

According to an exemplary embodiment of the present disclosure, the method of fabricating a piezoelectric device package capable of maintaining a constant and stable frequency with respect to a change in an external temperature by measuring an accurate temperature of the piezoelectric device by a simple method may be provided.

In addition, the case in which the piezoelectric device is mounted and the temperature measuring device are separately fabricated and are then coupled to each other, whereby loss that may occur at the time of a fabricating process may be significantly decreased.

While exemplary embodiments have been shown and described above, it will be apparent to those skilled in the art that modifications and variations could be made without departing from the spirit and scope of the present disclosure as defined by the appended claims.

What is claimed is:

1. A piezoelectric device package comprising:
a case having a plurality of terminals disposed on a lower external surface thereof;
a piezoelectric device disposed in the case;
a temperature measuring device having thin film form and disposed on the lower external surface of the case; and
a cover member enclosing an upper portion of the case, wherein
the plurality of terminals include a temperature measuring device input terminal, a temperature measuring device output terminal, a piezoelectric device input terminal, and a piezoelectric device output terminal, each disposed in corners of the lower external surface of the case,
the temperature measuring device includes first piezoelectric device connecting electrodes connected to the piezoelectric device input terminal, and the piezoelectric device output terminal,
the temperature measuring device includes a temperature measuring device input electrode and a temperature measuring device output electrode connected to the temperature measuring device input terminal and the temperature measuring device output terminal, respectively, and
the first piezoelectric device connecting electrodes, the temperature measuring device input electrode, and the temperature measuring device output electrode are disposed in corners of the temperature measuring device.

2. The piezoelectric device package of claim 1, wherein the piezoelectric device has a first excitation electrode formed on an upper surface thereof and has a second excitation electrode formed on a lower surface thereof, the first and second excitation electrodes being formed on corners of the lower surface of the piezoelectric device, respectively.

3. The piezoelectric device package of claim 2, wherein the case has second piezoelectric device connecting electrodes formed in corners of a bottom surface of an inner portion thereof so as to correspond to the corners of the piezoelectric device on which the first and second excitation electrodes are formed.

4. The piezoelectric device package of claim 1, wherein the piezoelectric device has dummy electrodes formed on a lower surface thereof.

5. The piezoelectric device package of claim 1, wherein the cover member is formed of a metal.

6. The piezoelectric device package of claim 5, wherein at least one of the plurality of terminals that are connected to the temperature measuring device input electrode or the temperature measuring device output electrode are also electrically connected to the cover member via a penetration part defined by the case, and
the case is constructed of ceramic or polymer.

7. A method of fabricating a piezoelectric device package, comprising:
mounting a piezoelectric device in a case including a plurality of terminals disposed on a lower external surface thereof;
coupling a cover member to an upper portion of the case; and
coupling a temperature measuring device having a thin film form to the lower external surface of the case, wherein
the plurality of terminals include a temperature measuring device input terminal, a temperature measuring device output terminal, a piezoelectric device input terminal, and a piezoelectric device output terminal, each disposed in corners of the lower external surface of the case,
the temperature measuring device includes first piezoelectric device connecting electrodes connected to the piezoelectric device input terminal, and the piezoelectric device output terminal,
the temperature measuring device includes a temperature measuring device input electrode and a temperature measuring device output electrode connected to the temperature measuring device input terminal and the temperature measuring device output terminal, respectively, and
the first piezoelectric device connecting electrodes, the temperature measuring device input electrode, and the temperature measuring device output electrode are disposed in corners of the temperature measuring device.

* * * * *